United States Patent
Kim

(10) Patent No.: US 7,684,253 B2
(45) Date of Patent: Mar. 23, 2010

(54) FLASH MEMORY DEVICE HAVING A FUNCTION FOR REDUCING DATA INPUT ERROR AND METHOD OF INPUTTING THE DATA IN THE SAME

(75) Inventor: Duck Ju Kim, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/617,406

(22) Filed: Dec. 28, 2006

(65) Prior Publication Data

US 2007/0223295 A1    Sep. 27, 2007

(30) Foreign Application Priority Data

Mar. 27, 2006    (KR)    .................... 10-2006-0027409

(51) Int. Cl.
*G11C 16/06* (2006.01)
(52) U.S. Cl. ............... 365/185.25; 365/185.23; 365/185.18; 365/185.12
(58) Field of Classification Search ............ 365/185.12, 365/185.25, 185.23, 185.18
See application file for complete search history.

(56) References Cited

U.S. PATENT DOCUMENTS

| 6,614,715 | B2 * | 9/2003 | Tsao et al. ............... 365/238.5 |
| 6,751,124 | B2 | 6/2004 | Lee |
| 6,798,697 | B2 | 9/2004 | Hosono et al. |
| 6,882,569 | B2 | 4/2005 | Hosono et al. |
| 6,937,510 | B2 | 8/2005 | Hosono et al. |
| 7,016,229 | B2 | 3/2006 | Kim |

* cited by examiner

*Primary Examiner*—Hoai V Ho
*Assistant Examiner*—Kretelia Graham
(74) *Attorney, Agent, or Firm*—Townsend and Townsend and Crew LLP

(57) ABSTRACT

A flash memory device has a precharging section for precharging adequately in advance internal data lines included in an Y-decoder section whenever a process of inputting data into page buffer is performed, error in a second process of inputting data may be reduced by preventing the maintenance of data loaded to data lines in a first process of inputting data prior to the second process.

15 Claims, 7 Drawing Sheets

US 7,684,253 B2

FLASH MEMORY DEVICE HAVING A FUNCTION FOR REDUCING DATA INPUT ERROR AND METHOD OF INPUTTING THE DATA IN THE SAME

CROSS-REFERENCE TO RELATED APPLICATIONS

This application claims priority from Korean Patent Application No. 2006-27409, filed on Mar. 27, 2006, the contents of which are incorporated herein by reference in its entirety.

BACKGROUND OF THE INVENTION

The present invention relates to a semiconductor memory device, and more particularly relates to a flash memory device and a method of inputting data.

A common flash memory device can be erased and reprogrammed many times and has the ability to retain data even when power is turned off, and so it has been employed in various semiconductor memory devices.

The flash memory device employs page buffers for speeding up the programming or reading of large data. Accordingly, program and read operations in the flash memory device are performed on a page basis by the page buffers.

FIG. 1 is a view illustrating circuitry of a Y-decoder section in a common flash memory device.

Referring to FIG. 1, the Y-decoder section 10 is employed to input data into one of the page buffers PB0 to PBn. FIG. 1 shows schematically latch LAT0 and a data input circuit DIC0 of page buffer PB0, in the left top corner. The Y-decoder section 10 includes a plurality of selecting sections 10A to 10S connected between the page buffers PB0 to PBn and data lines DL0 to DLk.

The selecting sections 10A to 10S have the same structure, e.g. 10A includes N-MOS transistors NC0 to NCc, NB0 to NBb, NA0 to NAx.

The Y-decoder section 10 connects a page buffer selected from the page buffers PB0 to PBn to a data line, e.g. DL0 selected from the data lines DL0 to DLk in response to Y-decoder driving signals YC_DRV<0:C>, YB_DRV<0:B> and YA_DRV<0:A>, thereby forming a data input path.

An operating controller 11 is connected respectively to the data lines DL0 to DLk, thereby supplying the data lines DL0 to DLk with a ground voltage or a supply voltage in accordance with discharging signals DL0_DIS to DLk_DIS. Accordingly, the data input path is discharged to a low level by the discharging signals DL0_DIS to DLk_DIS in a process of inputting data.

FIG. 2 is a timing diagram illustrating signals related to operation of inputting data using the Y-decoder section in FIG. 1.

Hereinafter, a process of inputting data in the flash memory device will be described in detail with reference to FIG. 1 and FIG. 2. It is assumed that first data "0" is inputted into page buffers PB0 to PB3, and second data "1" is inputted into page buffers PBk to PBk+3.

The operating controller 11 connects data line, e.g. DL0 to the supply voltage in response to a discharge signal having low level. Additionally, the Y-decoder section 10 connects internal data lines YA, YB and YC to the data line DL0 in accordance with first, second and third driving signals YC_DRV<0:C>, YB_DRV<0:B> and YA_DRV<0:A> having high level. As a result, the internal data lines YA, YB and YC are precharged to high level.

Then, the first, second and third driving signals YC_DRV<0:C>, YB_DRV<0:B> and YA_DRV<0:A> are disabled so that the data line DL0 is disconnected from the internal data lines YA, YB and YC Subsequently, the operating controller 11 connects the data line, e.g. DL0 to the ground voltage in response to discharge signal DL0_DIS having high level, thereby discharging the data line DL0. The N-MOS transistor NC0 and the N-MOS transistor NB0 are turned on in response to the third driving signal YC_DRV<0> and the second driving signal YB_DRV<0>, respectively, and so the first internal data line YC is connected to the data line DL0, and the second internal data line YB is connected to the first internal data line YC. As a result, the data line DL0 is connected to the second internal data line YB through the first internal data line YC.

Then, the N-MOS transistor NA0 is turned on in response to the first driving signal YA_DRV<0>, and so the input/output data line YA is connected to the second internal data line YB. In this case, an N-MOS transistor NDI1 in the data input circuit DIC0 is turned on in response to a data input signal nDI, and so the input/output data line YA is connected to the latch LAT0. Accordingly, the data line DL0 coupled to the ground voltage is connected to the first internal data line YC, the second internal data line YB, the input/output data line YA and the latch LAT0 in the page buffer PB0, and so "0" data is inputted into the page buffer PB0.

Subsequently, first driving signals YA_DRV<1> to YA_DRV<3> are enabled in sequence, and so first data "0" is inputted in sequence into the page buffer PB1 to PB3. The operating controller 11 connects the data line DL0 to the supply voltage in response to the discharge signal DL0_DIS having low level. In addition, the Y-decoder section 10 connects the internal data lines YB and YC and the input/output data line YA to the data line DL0 in accordance with the first, second and third driving signals YC_DRV<0:C>, YB_DRV<0:B> and YA_DRV<0:A> having high level. Consequently, the input/output data line YA and the internal data lines YB and YC are precharged to a high level. Here, since many internal data lines must be precharged through one data line, e.g. DL0 during a predetermined period of time, the internal data lines may be precharged incompletely.

Then, the second data "1" is inputted into the page buffers PBk to PBk+3. Particularly, the third driving signal YC_DRV<0> is disabled, and the third driving signal YC_DRV<C> is enabled. Accordingly, new data path ② different from the data path ① formed when the first data was inputted is formed, and so the second data is inputted into the selected page buffers PBk to PBk+3. In this case, the first data "0" may be with loading condition by the data lines precharged incompletely in the precharging process, e.g. input/output data line YA connected to the page buffers PB0 to PB3.

This phenomenon occurs because the data lines are increased as the data capacity of a memory device is increased, and the memory device uses lower voltages, and so data lines are precharged incompletely.

In this case, the second data "1" is inputted into the page buffers PBk to PBk+3 accordingly as the data input signal DI is provided. In case that the input/output data line YA connected to the page buffers PB0 to PB3 is precharged incompletely, i.e. keeps low level, the second data "1" is inputted again into the page buffers PB0 to PB3 which were latching the first data "0" as shown in 'A' of FIG. 2, and so errors may occur in the process of inputting the data.

SUMMARY OF THE INVENTION

It is a feature of the present invention to provide a flash memory device for reducing errors during a process of inputting data. This is done by minimizing charge residuals (or the maintenance of data) in the data lines by using a precharging section for adequately precharging internal data lines included in an Y-decoder section whenever a process of inputting data into a page buffer is performed.

A flash memory device according to one embodiment of the present invention includes a memory cell array, page buffers, a Y-decoder section and a precharging section. The memory cell array has a plurality of memory cells coupled to a plurality of bit line pairs. The page buffers are coupled respectively to the bit line pairs, sense data from selected memory cell of the memory cells, output the sensed data into to input/output data lines in a reading operation, and output input data transmitted from the input/output data lines to selected memory cell of the memory cells in a data input operation. The Y-decoder section couples one of the input/output data lines to one of the data lines by using one of internal data lines in response to Y-decoder driving signal, thereby forming data input path of at least one of the page buffers. The precharging section precharges each of the internal data lines in response to first and second precharging signals, thereby initializing the internal data lines.

A method of inputting data in a flash memory device according to one embodiment of the present invention includes precharging first internal data lines and second internal data lines in response to first and second precharging signals; forming a data path made up of one of the input/output data lines, one of the first internal data lines, one of the second internal data lines and one of the data lines in response to first to third decoder driving signals; and inputting data into page buffer coupled to one of the input/output data lines through the data path in response to a data input signal.

As described above, a flash memory device according to one embodiment of the present invention has a precharging section for precharging adequately the internal data lines included in a Y-decoder section whenever a process of inputting data into a page buffer is performed, errors during a second process of inputting data may be reduced by preventing the maintenance of data loaded in the data lines during a first process of inputting data prior to the second process.

BRIEF DESCRIPTION OF THE DRAWINGS

The features and advantages of the present invention will become readily apparent by reference to the following detailed description when considered in conjunction with the accompanying drawings wherein.

DESCRIPTION OF SPECIFIC EMBODIMENTS

Hereinafter, the embodiments of the present invention will be explained in more detail with reference to the accompanying drawings.

Figure 1:
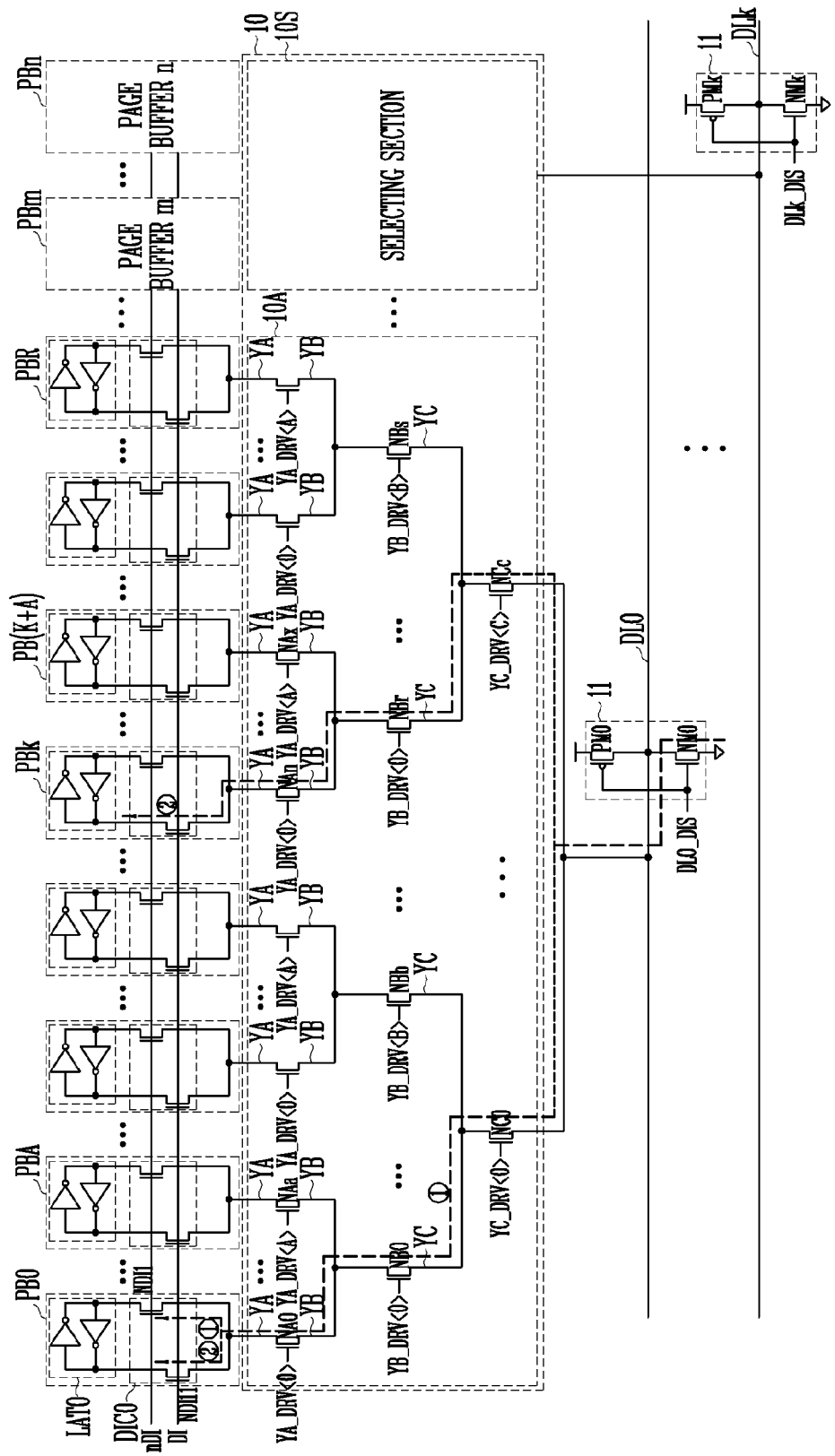
FIG. 1 is a view illustrating circuitry of a Y-decoder section in a common flash memory device.
Figure 2:
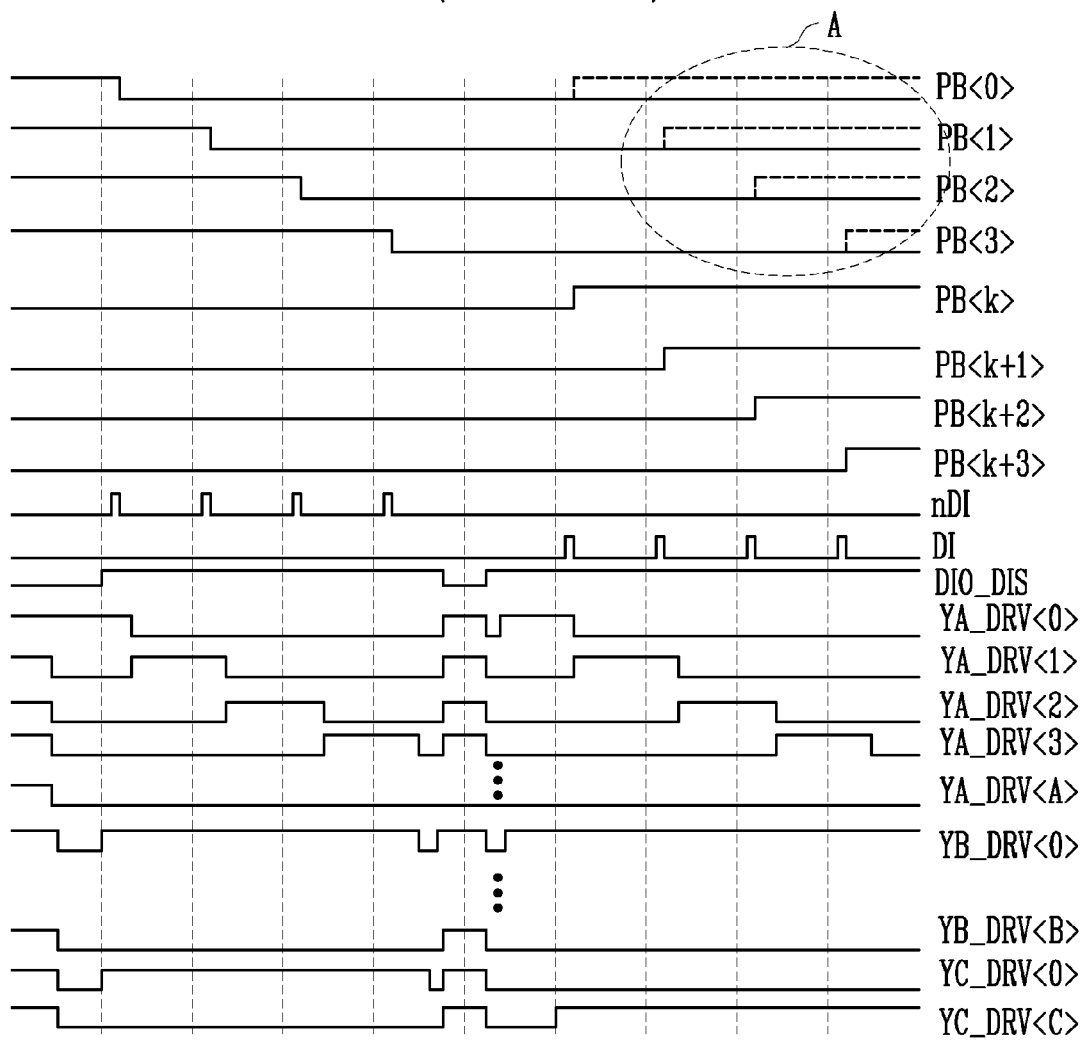
FIG. 2 is a timing diagram illustrating signals related to operation of inputting data using the Y-decoder section in FIG. 1.
Figure 3:
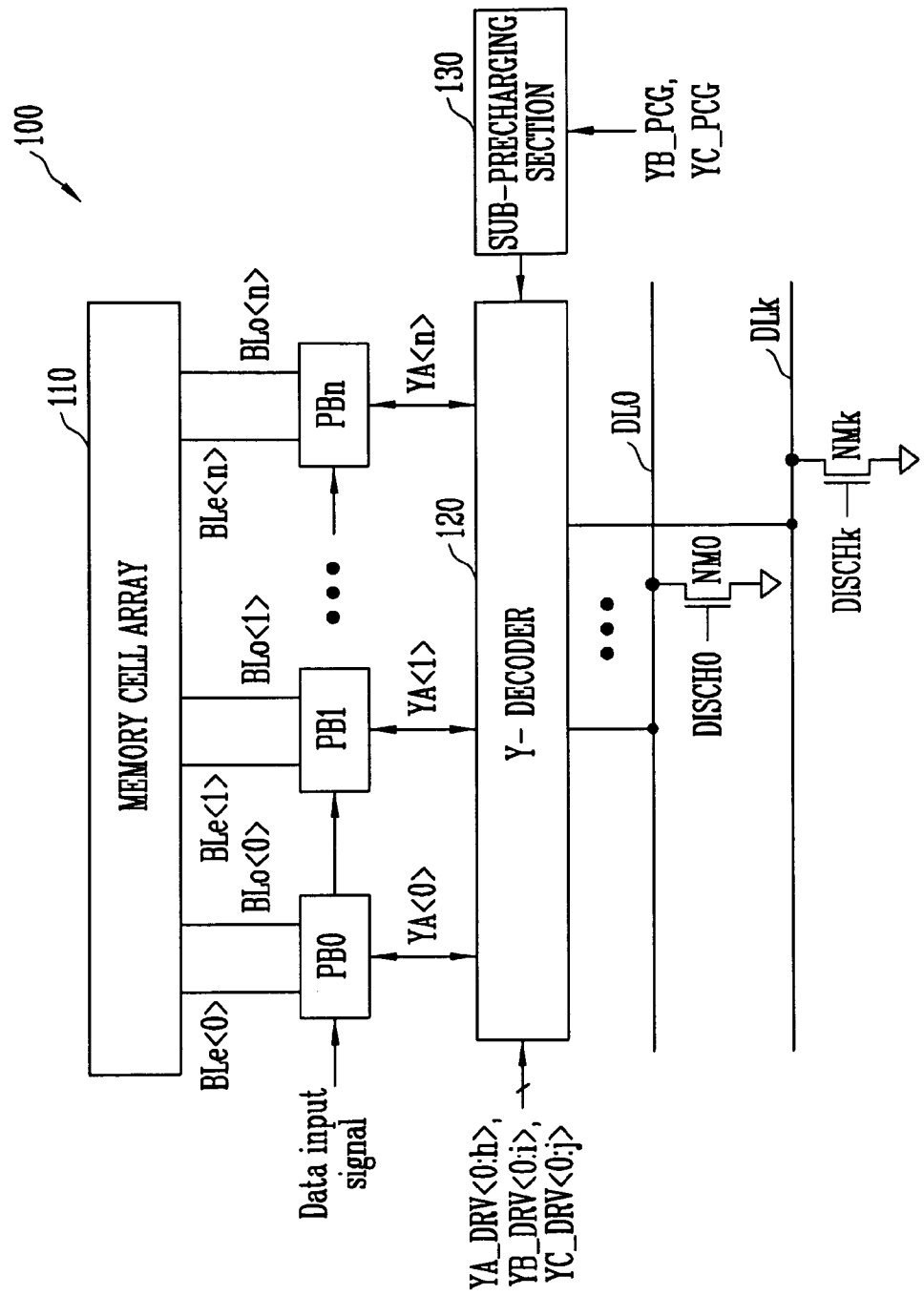
FIG. 3 is a block diagram illustrating a flash memory device according to one embodiment of the present invention.

FIG. 3 is a block diagram illustrating a flash memory device according to one embodiment of the present invention.

Referring to FIG. 3, the flash memory device of the present invention includes a memory cell array 110, a plurality of page buffers PB0 to PBn, a Y-decoder section 120 and a precharging section 130.

The memory cell array 110 includes a plurality of memory cells (not shown) coupled to bit line pairs BLe<0>, BLo<0> to BLe<n>, BLo<n>.

The page buffers PB0 to PBn are coupled to the bit line pairs BLe<0>, BLo<0> to BLe<n>, BLo<n>, respectively. Each of the page buffers PB0 to PBn transmits program data into the memory cell coupled to the bit line pairs BLe<0>, BLo<0> to BLe<n>, BLo<n>, or read data cell from the memory cell, and then outputs the read data to the input/output data line YA<0> to YA<n>.

The Y-decoder section 120 is coupled to the page buffers PB0 to PBn through the input/output data line YA<0> to YA<n>. In addition, the Y-decoder section 120 forms data input paths and transmits input data to selected page buffers (at least one of PB0 to PBn) in response to Y-decoder driving signals YA_DRV<0:h>, YB_DRV<0:i>, YC_DRV<0:j>; where h, i and j are integers.

The precharging section 130 provides precharge voltage to the Y-decoder section 120 in response to precharging signals YB_PCG and YC_PCG, thereby initializing the Y-decoder section 120 for a process of inputting data.

Figure 4:
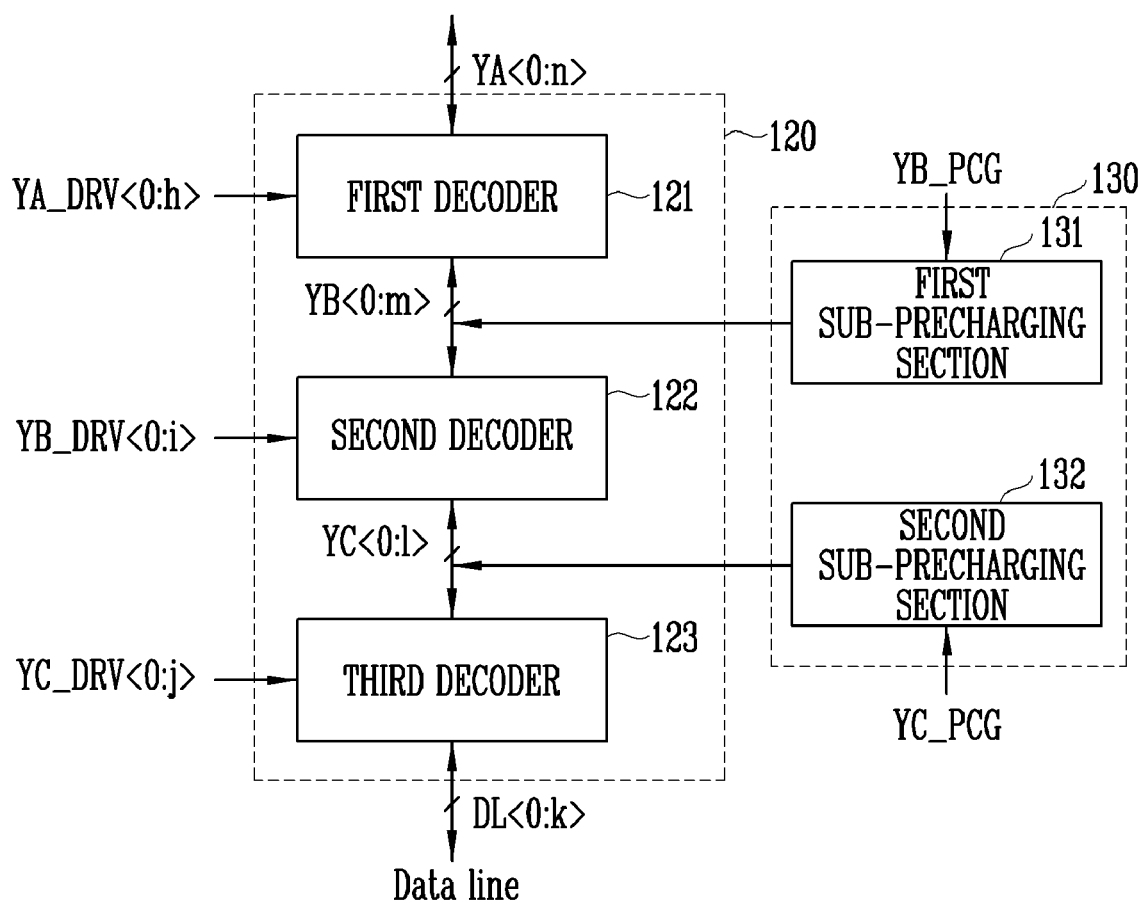
FIG. 4 is a block diagram illustrating the Y-decoder section and the precharging section in FIG. 3.

FIG. 4 is a block diagram illustrating the Y-decoder section and the precharging section in FIG. 3.

The Y-decoder section 120 includes a first decoder 121, a second decoder 122 and a third decoder 123.

The first decoder 121 couples selectively each of first internal data lines YB<0:m> to the input/output data lines YA<0:n> in response to first decoder driving signal YA_DRV<0:h>, where m and n are integers.

The second decoder 122 couples selectively each of second internal data lines YC<0:l> to first internal data line YB<0:m> in response to second decoder driving signal YB_DRV<0:i>, where l is an integer.

The third decoder 123 couples selectively each of data lines DL<0:k> to the second internal data lines YC<0:l> in response to third decoder driving signal YC_DRV<0:j>, where k is an integer.

N-MOS transistors NM0 to NMk are coupled to the data lines DL<0:k>, respectively. Here, the N-MOS transistors NM0 to NMk are turned on in response to the discharging signals DISCH0 to DISCHk, thereby coupling the data line DL<0:k> to a ground voltage.

The precharging section 130 includes a first sub-precharging section 131 and a second sub-precharging section 132.

The first sub-precharging section 131 precharges the first internal data lines YB<0:m> in response to a first precharging signal YB_PCG.

Figure 5:
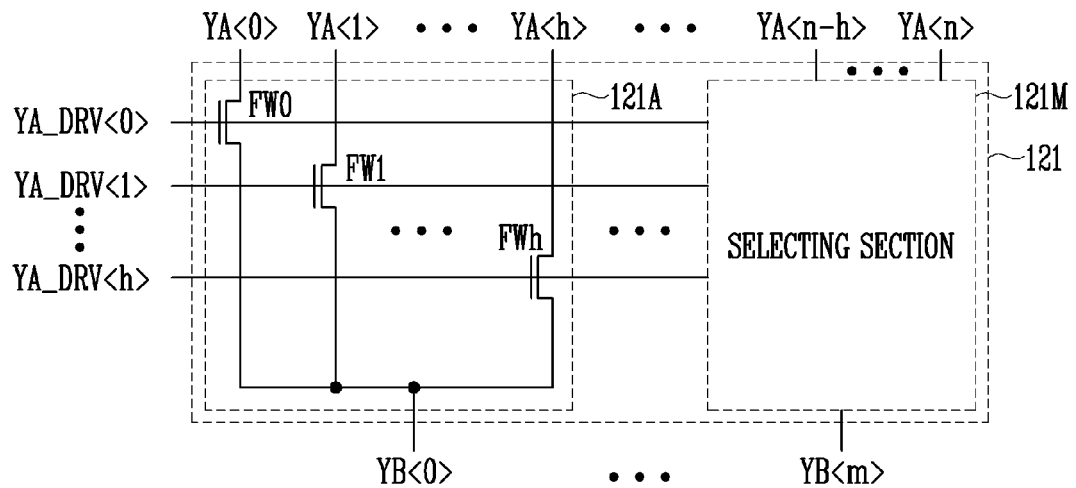
FIG. 5 is a view illustrating circuitry of the first decoder in FIG. 4.

The second sub-precharging section 132 precharges the second internal data lines YC<0:l> in response to a second precharging signal YC_PCG FIG. 5 is a view illustrating the circuitry of the first decoder in FIG. 4.

The first decoder 121 includes a plurality of selecting sections 121A to 121M.

The selecting sections 121A to 121M are coupled to the first internal data lines YB<0:m>, respectively.

Hereinafter, since the selecting sections 121A to 121M are all similar to one another in components and operation, only the selecting section 121A coupled to a first internal data line YB<0> will be described as an example.

The selecting section 121A includes a plurality of switches FW0 to FWh. Here, the switches FW0 to FWh according to one embodiment of the present invention are N-MOS transistors.

Hereinafter, it is assumed that each of the switches FW0 to FWh are N-MOS transistors.

The N-MOS transistors FW0 to FWh are coupled between the first internal data line YB<0> and the input/output data line YA<0> to YA<h>, and are turned on/off in response to first driving signals YA_DRV<0> to YA_DRV<h>, respectively. For example, the N-MOS transistor FW0 is turned on in response to the first driving signal YA_DRV<0>, thereby coupling the input/output data line YA<0> to the first internal data line YB<0>.

As described above, one selecting section 121A is coupled to one first internal data line YB<0>, and so the first internal data line YB<0> is selectively coupled to at least one of the input/output data lines YA<0:h>.

Figure 6:
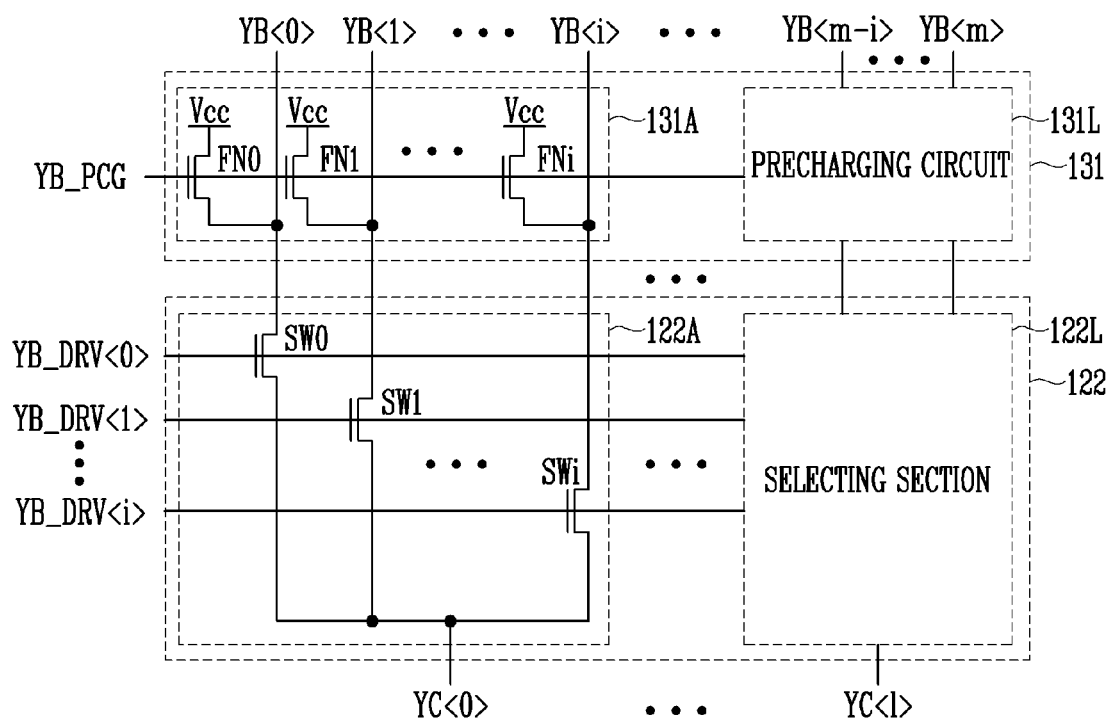
FIG. 6 is a view illustrating circuitry of the second decoder and the first sub-precharging section in FIG. 4.

FIG. 6 is a view illustrating the circuitry of the second decoder and the first sub-precharging section in FIG. 4.

The second decoder 122 includes a plurality of selecting sections 122A to 122L, and the first sub-precharging section 131 has a plurality of precharging circuits 131A to 131L.

The selecting sections 122A to 122L and the precharging circuits 131A to 131L are coupled to the second internal data lines YC<0:l>, respectively.

Hereinafter, since the selecting sections 122A to 122L are similar to one another in components and operation and the precharging circuits 131A to 131L are similar to one another in components and operation, only the selecting section 122A and the precharging circuit 131A coupled to the second internal data line YC<0> will be described as an example.

The selecting section 122A has a plurality of switches SW0 to SWi. Here, the switches SW0 to SWi according to one embodiment of the present invention are N-MOS transistors.

Hereinafter, it is assumed that each of the switches SW0 to SWi are N-MOS transistors.

The N-MOS transistors SW0 to SWi are coupled between the second internal data line YC<0> and the first internal data lines YB<0> to YB<i>, and are turned on/off in response to second driving signals YB_DRV<0> to YB_DRV<i>, respectively. For instance, the N-MOS transistor SW0 is turned on in response to the second driving signal YB_DRV<0>, thereby coupling the first internal data line YB<0> to the second internal data line YC<0>.

As described above, one selecting section 122A is coupled to one second internal data line YC<0>, and so the second internal data line YC<0> is selectively coupled to at least one of the first input data lines YB<0:i>.

The precharging circuit 131A includes a plurality of switches FN0 to FNi coupled to the first internal data lines YB<0:i>, respectively. Here, the switches FN0 to FNi according to one embodiment of the present invention are N-MOS transistors.

Hereinafter, it is assumed that each of the switches FN0 to FNi are N-MOS transistors.

The N-MOS transistors FN0 to FNi are coupled between the first internal data lines YB<0> to YB<i> and a supply voltage Vcc, and are turned on/off in response to a first pre-charging signal YB_PCG, respectively. For example, the N-MOS transistor FN0 is turned on in response to the first precharging signal YB_PCG, thereby precharging the first internal data line YB<0> to the level of the supply voltage Vcc.

Figure 7:
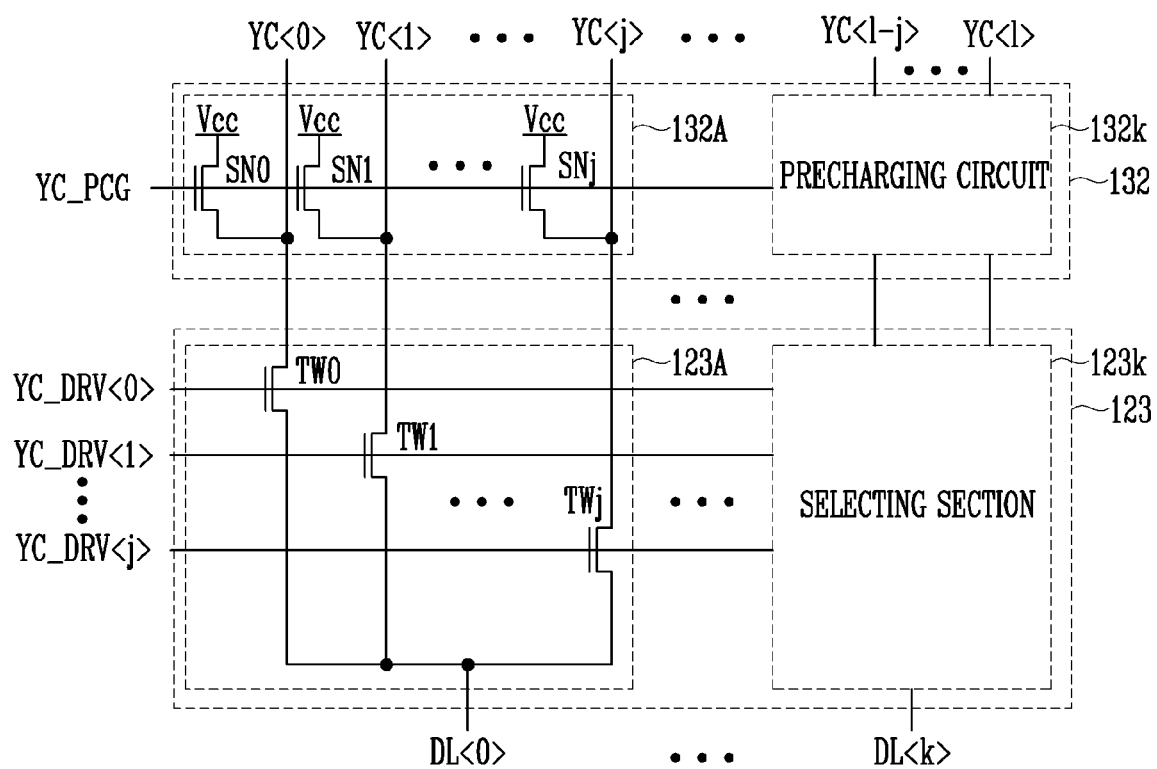
FIG. 7 is a view illustrating circuitry of the third decoder and the second sub-precharging section in FIG. 4.

FIG. 7 is a view illustrating circuitry of the third decoder and the second sub-precharging section in FIG. 4.

The third decoder 123 includes a plurality of selecting sections 123A to 123K, and the second sub-precharging section 132 has a plurality of precharging circuits 132A to 132K.

The selecting sections 123A to 123K and the precharging circuits 132A to 132K are coupled to the data lines DL<0:k>, respectively.

Hereinafter, since the selecting sections 123A to 123K are similar to one another in components and operation and the precharging circuits 132A to 132K are similar to one another in components and operation, only the selecting section 123A and the precharging circuit 132A coupled to one data line DL<0> will be described as an example.

The selecting section 123A includes a plurality of switches TW0 to TWj. Here, the switches TW0 to TWj according to one embodiment of the present invention are N-MOS transistors.

Hereinafter, it is assumed that each of the switches TW0 to TWj are N-MOS transistors.

The N-MOS transistors TW0 to TWj are coupled between the data line DL<0> and the second internal data line YC<0> to YC<j>, and are turned on/off in response to third driving signals YC_DRV<0> to YC_DRV<j>, respectively. For example, the N-MOS transistor TW0 is turned on in response to the third driving signal YC_DRV<0>, thereby coupling the second data line YC<0> to the data line DL<0>.

As described above, one selecting section 123A is coupled to one data line DL<0>, and so the data line DL<0> is selectively coupled to at least one of the second data lines YC<0:j>.

The precharing circuit 132A includes a plurality of switches SN0 to SNj coupled to the second internal data lines YC<0:j>, respectively.

Here, the switches SN0 to SNj according to one embodiment of the present invention are N-MOS transistors.

Hereinafter, it is assumed that each of the switches SN0 to SNj are N-MOS transistors.

The N-MOS transistors SN0 to SNj are coupled between the second internal data lines YC<0> to YC<j> and the supply voltage Vcc, and are turned on/off in response to second precharging signals YC_PCG. For instance, the N-MOS transistor SN0 is turned on in response to the second precharging signal YC_PCG, thereby precharging the second internal data line YC<0> to the level of the supply voltage Vcc.

Hereinafter, a process of inputting data in the flash memory device according to one embodiment of the present invention will be described in detail with reference to FIG. 3 to FIG. 8.

Figure 8:
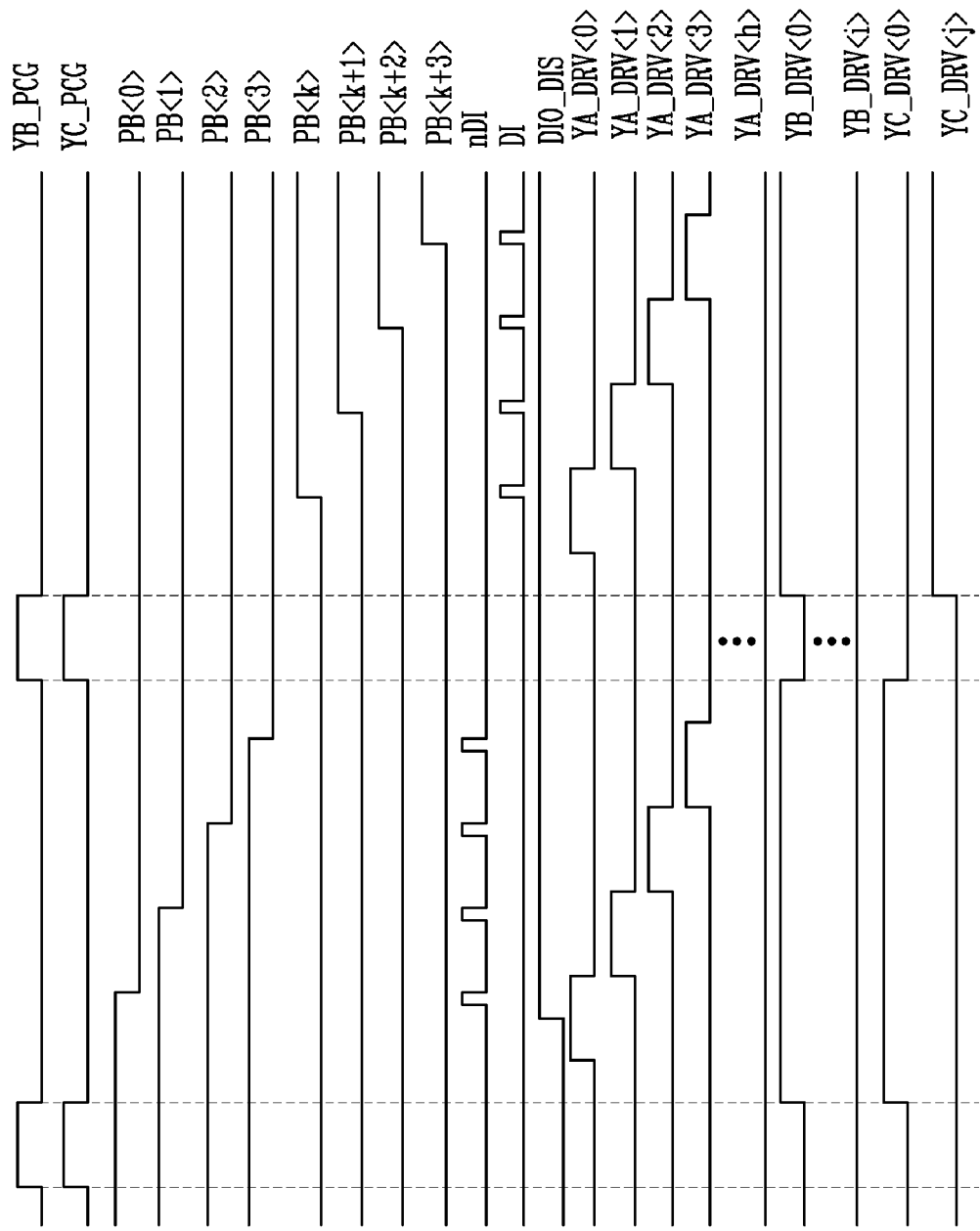
FIG. 8 is a timing diagram illustrating signals related to operation of inputting data using the flash memory device in FIG. 4.

FIG. 8 is a timing diagram illustrating signals related to the operation of inputting data using the flash memory device in FIG. 4. Here, it is assumed that first data "0" is inputted into the page buffers PB<0> to PB<3>, and second data "1" is inputted into the page buffers PB<k> to PB<k+3>, where k is integer higher than 3 and lower than n. In addition, one data line DL0 will be described as an example for all the data lines DL<0:k> for convenience.

Firstly, the N-MOS transistors FN0 to FNi are turned on for a predetermined period of time in response to the first precharging signal YB_PCG having a high level. As a result, the first internal data line YB<0:m> is precharged to the level of the supply voltage Vcc. Additionally, the N-MOS transistors SN0 to SNj are turned on for a preset period of time in response to the second precharging signal YC_PCG having a high level. Accordingly, the second internal data line YC<0:j> is precharged to the level of the supply voltage Vcc. In this case, since the first, second and third driving signals YA_DRV<0:h>, YB_DRV<0:i> to YC_DRV<0:j> are disabled, the input/output data line YA<0:h>, the first internal data line YB<0:i>, the second internal data line YC<0:j> and the data line DL0 are disconnected electrically from one another.

Subsequently, a process of forming data input paths for inputting the first data into the page buffers, e.g. PB<0> to PB<3> is performed.

The N-MOS transistor NM0 is turned on in response to a discharging signal DISCH0 having high level, thereby coupling the data line DL0 to the supply voltage Vcc.

The Y-decoder driving signals YA_DRV<0:h>, YB_DRV<0:i> and YC_DRV<0:j> are provided to the Y-decoder section 120. Particularly, the N-MOS transistor TW0 is turned on in response to the third decoder driving signal YC_DRV<0> having a high level, thereby coupling the data line DL<0> to the second internal data line YC<0>. The other third decoder driving signals YC_DRV<1> to YC_DRV<j> keep disable condition, i.e. low level. Accordingly, the data line DL<0> and the second internal data lines YC<1> to YC<j> maintains a disconnected condition.

The N-MOS transistor SW0 is turned on in response to the second decoder driving signal YB_DRV<0> having a high level, thereby coupling the second internal data line YC<0> to the first internal data line YB<0>. The other second decoder driving signals YB_DRV<1> to YB_DRV<i> keep disable condition, i.e. low level. As a result, the second internal data line YC<0> and the first internal data lines YB<1> to YB<i> maintain disconnected condition.

Since the data line DL<0> is coupled to the ground voltage, the second internal data line YC<0> coupled to the data line DL0 and the first internal data line YB<0> are discharged to a low level. In this case, the second internal data lines YC<1> to YC<j> and the first internal data lines YB<1> to YC<i> disconnected electrically to the data line DL0 keeps precharge condition, i.e. high level.

Subsequently, the first driving signals YA_DRV<0> to YA_DRV<3> are enabled in turn whenever the data input signal nDI is enabled periodically. As a result, the first data "0" is inputted in sequence to the page buffers PB0 to PB3.

Then, data input path for inputting the second data into other page buffers, e.g. PB<k> to PB<k+3> is formed after the above precharging process is performed again.

The Y-decoder driving signals YA_DRV<0:h>, YB_DRV<0:i> and YC_DRV<0:j> are provided selectively to the Y-decoder section 120. The N-MOS transistor TWj is turned on in response to the third decoder driving signal YC_DRV<j> having a high level, thereby coupling the data line DL<0> to the second internal data line YC<j>. The other third decoder driving signals YC_DRV<0> to YC_DRV<j−1> keep disable condition, i.e. low level. As a result, the data line DL<0> and the second internal data lines YC<0> to YC<j−1> are disconnected electrically.

The N-MOS transistor SW0 is turned on in response to the second decoder driving signal YB_DRV<0>, thereby coupling the second internal data line YC<j> to the first internal data line YB<0>. The other second decoder driving signals YB_DRV<1> to YB_DRV<i> keep disable condition. Accordingly, the second internal data line YC<j> and the first internal data lines YB<1> to YB<i> are disconnected electrically. In this case, the other second internal data lines YC<1> to YC<j> and the first internal data lines YB<1> to YC<i> disconnected to the data line DL0 maintain precharge condition, i.e. high level.

Subsequently, the first driving signals YA_DRV<0> to YA_DRV<3> are enabled in turn whenever the data input signal DI is enabled periodically. As a result, the second data "1" is inputted in sequence to the page buffers PBk to PBk+3.

The above operations of inputting the first data and the second data are repeated so that the first data or the second data is inputted into the page buffers PB1 to PBn.

As described above, the first internal data lines YB<0:i> and the second internal data lines YC<0:j> are precharged to high level by the first and second sub-precharging sections 131 and 132 before a data input path is formed by the Y-decoder section 120 for inputting the second data. As a result, the data input path formed by the operation of inputting the first data is precharged to high level before the operation of inputting the second data so that the first internal data lines YB<0:i> and the second internal data lines YC<0:j> are initialized.

In short, the flash memory device of the present invention prevents the maintenance of data loaded into the data lines by a first data input operation when the data input path for inputting second data is formed, and so errors in the page buffers of the first data during the inputting of the second data may be reduced. Here, the second data is inputted into the page buffers after the first data is inputted to the page buffers.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the scope of one skilled in the art to effect such feature, structure, or characteristic in connection with other embodiments.

Although embodiments have been described with reference to a number of illustrative embodiments, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flash memory device comprising:
   a memory cell array configured to have a plurality of memory cells coupled to a plurality of bit line pairs;
   a plurality of page buffers coupled respectively to the bit line pairs, the plurality of page buffers being configured to sense data from a selected memory cell of the memory cells and to output the sensed data into first data lines in a reading operation, and input data transmitted from the first data lines to the selected memory cell of the memory cells in a data input operation;
   a Y-decoder section configured to couple one of the first data lines to one of second data lines by using one of internal data lines in response to a Y-decoder driving signal, thereby forming a data input path of at least one of the page buffers;
   a precharging section configured to precharge each of the internal data lines in response to first and second precharging signals during the data input operation; and a discharge element which is connected to the respective second data lines, wherein the discharge element discharges the internal data lines in response to a discharge signal during the data input operation.

2. The flash memory device of claim 1, wherein the internal data lines include first internal data lines and second internal data lines, wherein the Y-decoder section includes:

a first decoder coupled between the first internal data lines and the first data lines, the first decoder being configured to couple the first internal data lines to at least one of the first data lines in response to first driving signals;

a second decoder coupled between the second internal data lines and the first internal data lines, the second decoder being configured to couple the second internal data lines to at least one of the first internal data lines in response to second driving signals; and a third decoder coupled between the second data lines and the second internal data lines, the third decoder being configured to couple at least a portion of the second data lines to at least one of the second internal data lines in response to third driving signals.

3. The flash memory device of claim 2, wherein the precharging section includes:

a first sub-precharging section configured to precharge the first internal data lines to level of a supply voltage in response to the first precharging signal; and a second sub-precharging section configured to precharge the second internal data lines to the level of the supply voltage in response to the second precharging signal.

4. The flash memory device of claim 2, wherein the first decoder includes a plurality of selecting sections coupled respectively between the first internal data lines and the first data lines, and the first decoder configured to couple one of the first internal data lines to a portion of the first data lines in response to the first driving signals.

5. The flash memory device of claim 2, wherein the second decoder includes a plurality of selecting sections coupled respectively between the second internal data lines and the first internal data lines, the second decoder configured to couple one of the second internal data lines to at least one of the first internal data lines in response to the second driving signals.

6. The flash memory device of claim 2, wherein the third decoder includes a plurality of selecting sections coupled respectively between the second data lines and the second internal data lines, the third decoder configured to couple one of the second data lines to at least one of the second internal data lines in response to the third driving signals.

7. The flash memory device of claim 4, wherein each of the selecting sections includes a plurality of switches for coupling one of the first internal data lines to at least one of the first data lines in response to the first driving signals.

8. The flash memory device of claim 5, wherein each of the selecting sections includes a plurality of switches for coupling one of the second internal data lines to at least one of the first internal data lines in response to the second driving signals.

9. The flash memory device of claim 6, wherein each of the selecting sections includes a plurality of switches for coupling one of the second data lines to at least one of the second internal data lines in response to the third driving signals.

10. The flash memory device of claim 3, wherein the first sub-precharging section includes a plurality of switches coupled respectively between the supply voltage and the first internal data lines, the first sub-precharging section being configured to supply the supply voltage to the first internal data lines in response to the first precharging signal.

11. The flash memory device of claim 10, wherein each of the switches is a MOS transistor.

12. The flash memory device of claim 3, wherein the second sub-precharging section includes a plurality of switches coupled respectively between the supply voltage and the second internal data lines, the second sub-precharging section being configured to supply the supply voltage to the second internal data lines in response to the second precharging signal.

13. The flash memory device of claim 12, wherein each of the switches is a MOS transistor.

14. A method of inputting data in a flash memory device, the method comprising:

precharging a plurality of first internal data lines and a plurality of second internal data lines in response to first and second precharging signals during a data input operation;

forming data path comprising one of first data lines, one of the first internal data lines, one of the second internal data lines and one of a second data lines in response to first to third decoder driving signals; and discharging the data path in response to a discharge signal.

15. The flash memory device of claim 1, wherein the discharge device includes a NMOS transistor.

* * * * *